(12) United States Patent
Kim et al.

(10) Patent No.: US 10,096,756 B2
(45) Date of Patent: Oct. 9, 2018

(54) SIDE VIEW LIGHT EMITTING DIODE PACKAGE

(71) Applicant: SAMSUNG ELECTRONICS CO., LTD., Suwon-si, Gyeonggi-Do (KR)

(72) Inventors: Chang Wook Kim, Kyungki-Do (KR); Yoon Suk Han, Seoul (KR); Young Jae Song, Seoul (KR); Byung Man Kim, Choongchungnam-Do (KR); Jae Ky Roh, Kyungki-Do (KR); Seong Jae Hong, Kyungki-Do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/201,967

(22) Filed: Jul. 5, 2016

(65) Prior Publication Data

US 2016/0315239 A1 Oct. 27, 2016

Related U.S. Application Data

(63) Continuation of application No. 11/603,839, filed on Nov. 24, 2006, now abandoned.

(30) Foreign Application Priority Data

Nov. 25, 2005 (KR) .................. 10-2005-0113834

(51) Int. Cl.
*H01L 33/62* (2010.01)
*F21V 8/00* (2006.01)
(Continued)

(52) U.S. Cl.
CPC ............ *H01L 33/62* (2013.01); *G02B 6/0073* (2013.01); *H01L 33/483* (2013.01); *H01L 33/54* (2013.01);
(Continued)

(58) Field of Classification Search
CPC . H01L 2224/48247; H01L 2224/32245; H01L 2224/48471; H01L 2224/73265;
(Continued)

(56) References Cited

U.S. PATENT DOCUMENTS 6,335,548 B1 1/2002 Roberts et al.
6,864,166 B1 3/2005 Yin et al.
(Continued)

FOREIGN PATENT DOCUMENTS

CN 10602555 A 3/2005
CN 1630133 A 6/2005
(Continued)

OTHER PUBLICATIONS

United States Office Action issued in U.S. Appl. No. 12/550,073 dated Aug. 5, 2013.
(Continued)

*Primary Examiner* — (Vikki) Hoa B Trinh
(74) *Attorney, Agent, or Firm* — F. Chau & Associates, LLC

(57) ABSTRACT

A side view LED package for a backlight unit includes a package body having a cavity with an inclined inner sidewall, first and second lead frames arranged in the package body, the cavity of the package body exposing a portion of at least one of the first and second lead frames placed in a bottom of the cavity to outside, a light emitting diode chip mounted on the bottom of the cavity to be electrically connected to the first and second lead frames, and a transparent encapsulant arranged in the cavity surrounding the light emitting diode chip. The cavity has a depth larger than a mounting height of the light emitting diode chip and not exceeding six times of the mounting height. The height of the sidewall is shortened to improve beam angle character-
(Continued)

istics of emission light, increase light quantity, and prevent a molding defect of the sidewall.

10 Claims, 16 Drawing Sheets

(51) Int. Cl.
  *H01L 33/48* (2010.01)
  *H01L 33/60* (2010.01)
  *H01L 33/54* (2010.01)
(52) U.S. Cl.
  CPC .... *H01L 33/60* (2013.01); *H01L 2224/32245* (2013.01); *H01L 2224/48091* (2013.01); *H01L 2224/48247* (2013.01); *H01L 2224/48465* (2013.01); *H01L 2224/48471* (2013.01); *H01L 2224/73265* (2013.01)
(58) Field of Classification Search
  CPC . H01L 2224/48465; H01L 2224/48091; H01L 33/60; H01L 33/62; H01L 33/54; H01L 33/483
  See application file for complete search history.

(56) References Cited

U.S. PATENT DOCUMENTS

| | | | |
|---|---|---|---|
| 6,897,490 B2 | 5/2005 | Brunner et al. | |
| 2004/0046242 A1 | 3/2004 | Asakawa | |
| 2004/0075100 A1 | 4/2004 | Bogner et al. | |
| 2004/0080938 A1* | 4/2004 | Holman | F21S 8/08 362/231 |
| 2004/0120155 A1 | 6/2004 | Suenaga | |
| 2004/0240203 A1 | 12/2004 | Matsumura et al. | |
| 2005/0017259 A1 | 1/2005 | Han et al. | |
| 2005/0023538 A1 | 2/2005 | Ishii et al. | |
| 2005/0077623 A1 | 4/2005 | Roberts et al. | |
| 2005/0133939 A1 | 6/2005 | Chikugawa et al. | |
| 2005/0242365 A1 | 11/2005 | Yoo | |
| 2006/0092665 A1 | 5/2006 | Kim et al. | |
| 2007/0120234 A1 | 5/2007 | Kim et al. | |
| 2008/0239724 A1 | 10/2008 | Moriyama et al. | |
| 2009/0283792 A1 | 11/2009 | Kim et al. | |
| 2009/0321779 A1 | 12/2009 | Kim et al. | |

FOREIGN PATENT DOCUMENTS

| | | |
|---|---|---|
| DE | 199 01 916 A1 | 8/1999 |
| DE | 102 28 634 A1 | 1/2004 |
| DE | 10 2005 008 339 A1 | 10/2005 |
| JP | 63-200551 | 8/1988 |
| JP | 4-14943 U | 2/1992 |
| JP | 07-176791 A | 7/1995 |
| JP | H08-264842 A | 10/1996 |
| JP | 10-242529 A | 9/1998 |
| JP | 11-074561 | 3/1999 |
| JP | 2000138397 A | 5/2000 |
| JP | 2001-015542 | 1/2001 |
| JP | 2002-270859 A | 9/2002 |
| JP | 2003-008072 | 1/2003 |
| JP | 2003-008072 A | 1/2003 |
| JP | 2003-347345 A | 5/2003 |
| JP | 2003-168824 | 6/2003 |
| JP | 2003-209293 | 7/2003 |
| JP | 2003218401 | 7/2003 |
| JP | 2003-282957 A | 10/2003 |
| JP | 2003-347345 | 12/2003 |
| JP | 2003-347600 A | 12/2003 |
| JP | 2004-095969 | 3/2004 |
| JP | 2004-165541 A | 6/2004 |
| JP | 2004-207688 A | 7/2004 |
| JP | 2004-288827 A | 10/2004 |
| JP | 2004-363537 A | 12/2004 |
| JP | 2005-050838 | 2/2005 |
| JP | 2005-050838 A | 2/2005 |
| JP | 200545199 A | 2/2005 |
| JP | 2005-167136 | 6/2005 |
| JP | 2005-181808 A | 7/2005 |
| JP | 2005-203748 | 7/2005 |
| JP | 2005-235864 A | 9/2005 |
| JP | 2005-294736 A | 10/2005 |
| JP | 2005285899 A | 10/2005 |
| JP | 2005-353699 | 12/2005 |

OTHER PUBLICATIONS

Japanese Decision of Rejection, with English translation, issued in Japanese Patent Application No. 2006-317172, dated Jul. 26, 2011.
Japanese Decision to Decline Amendment, with English translation, issued in Japanese Patent Application No. 2006-317172, dated Jul. 26, 2011.
Japanese Office Action, and English translation thereof, issued in Japanese Patent Application No. 2011-25457 dated Mar. 13, 2012.
United States Office Action, issued in U.S. Appl. No. 12/510,520, dated Jun. 23, 2011.
Japanese Office Action, and English translation thereof, issued in Japanese Patent Application No. 2009-173332 dated Jun. 5, 2012.
European Search Report issued in European Patent Application No. 06256023.0 dated Jul. 16, 2012.
European Examination Report issued in European Patent Application No. 09075355.9 dated Jul. 11, 2012.
Chinese Office Action, and English translation thereof, issued in Chinese Patent Application No. 200610140337.8 dated Jul. 5, 2012.
Board Decision from the Chinese Patent Reexamination Board along with its English translation.
Office Action dated Nov. 13, 2012, in co-pending Japanese Patent Application No. 2006-317172.
Notice of Interrogation dated Jan. 22, 2013 issued in Japanese Patent Application No. 2009-173332.
European Search Report issued in European Patent Application No. EP 10075610.5 dated Mar. 21, 2011.
United States Office Action issued in U.S. Appl. No. 12/550,073 dated Jan. 24, 2011.
United States Office Action issued in U.S. Appl. No. 12/510,520 dated Jan. 25, 2011.
United States Office Action issued in U.S. Appl. No. 12/510,520 dated Feb. 4, 2010.
Chinese Office Action with English Translation, issued in Chinese Patent Application No. 200610140337.8 dated Feb. 1, 2008.
European Search Report issued in corresponding European Patent Application No. EP 06 25 6023, dated Mar. 12, 2007.
Japanese Office Action issued in Application No. 2012-223229 dated Apr. 28, 2015.
Office Action dated Jan. 12, 2015 issued in the corresponding Chinese Patent Application No. 201310042791.X (English translation).
Japanese Office Action issued in Application No. 2011-25457 dated Aug. 27, 2013.
Japanes Office Action issued in Application No. 2012-223229 dated Aug. 27, 2013.
Office Action issued in U.S. Appl. No. 11/603,839 dated Aug. 6, 2013.
Office Action dated Jan. 21, 2014 issued in the corresponding Japanese application No. 2006-317172.
Office Action issued in Japanese Patent Application No. 2009-173332 dated Jun. 25, 2013.
Office Action dated Dec. 7, 2012 issued in U.S. Appl. No. 12/510,520.
Japanese Office Action, w/ English translation thereof, issued in Japanese Patent Application No. JP 2006-317172 dated Mar. 12, 2013.
United States Office Action, issued in U.S. Appl. No. 11/603,839, dated Jul. 8, 2011.
Decision of Rejection, with English translation, issued in Japanese Patent Application No. 2006-317172, dated Jul. 11, 2011.
Decision to Decline Amendment, with English translation, issued in Japanese Patent Application No. 2006-317172, dated Jul. 11, 2011.

(56) References Cited

OTHER PUBLICATIONS

Japanese Office Action, with English translation, issued in Japanese Patent Application No. 2009-173332, dated Sep. 27, 2011.
Japanese Office Action, and English translation thereof, issued in Japanese Patent Application No. 2006-317172 dated Mar. 13, 2012.
United States Office Action issued in U.S. Appl. No. 12/510,520 dated Mar. 21, 2013.
Japanese Patent Court Decision, w/ English translation thereof, issued in Japanese Patent Application No. JP 2009-173332 dated Jan. 22, 2013.
Japanese Office Action, with English Translation, issued in Japanese Patent Application No. 2006-317172, dated Jan. 4, 2011.
Office Action dated Nov. 13, 2012, in co-pending Japanese Application No. 2006-317172.
Japanese Decision of Rejection, w/ English translation thereof, issued in Japanese Patent Application No. 2006-317172, dated Jul. 26, 2011.
Japanese Decision to Decline Amendment, w/ English translation thereof, issued in Japanese Patent Application No. 2006-317172, dated Jul. 26, 2011.
U.S. Office Action issued in U.S. Appl. No. 12/550,073, dated Jul. 19, 2011.
United States Office Action issued in U.S. Appl. No. 11/603,839 dated Nov. 2, 2010.
Japanese Office Action, w/ English translation thereof, issued in Japanese Patent Application No. JP 2006-317172 dated Jan. 4, 2011.
European Search Report issued in European Patent Application No. 10075610.5-2222, dated Mar. 21, 2011.
United States Office Action issued in U.S. Appl. No. 11/603,839, dated Mar. 29, 2010.
Japanese Office Action, w/ English translation thereof, issued in Japanese Patent Application No. JP 2006-317172 dated Apr. 20, 2010.
United States Office Action issued in U.S. Appl. No. 11/603,839, dated Sep. 16, 2009.

\* cited by examiner

SIDE VIEW LIGHT EMITTING DIODE PACKAGE

CLAIM OF PRIORITY

This application is a Continuation of co-pending U.S. patent application Ser. No. 11/603,839, filed on Nov. 24, 2006, which claims priority to, and the benefit of, Korean Patent Application No. 10-2005-113834 filed on Nov. 25, 2005, in the Korean Intellectual Property Office, the disclosures of which are herein incorporated by reference in their entireties.

BACKGROUND OF THE INVENTION

Field of the Invention

The present invention relates to a high power Light Emitting Diode (LED) package, particularly, in which the height of a sidewall is shortened to improve beam angle characteristics of emission light, increase light quantity, and prevent a molding defect of the sidewall.

Description of the Related Art

A Liquid Crystal Display (LCD) does not have a light source of its own, and thus requires an external illumination, which is generally referred to as a backlight unit. The backlight unit illuminates the LCD from the back and uses a Cold Cathode Fluorescent Lamp (CCFL) or an LED as a light source.

FIGS. 1 and 2 show a general backlight unit 1 in use for the LCD. Referring to FIGS. 1 and 2, the backlight unit 1 includes a plurality of LED packages 10, a light guide plate 20, a reflector sheet 24, a diffuser sheet 26 and a pair of prism sheets 28. With this arrangement, light incident from the LED package 10 into the light guide plate 20 is directed to an LCD panel 30 above, providing backlighting to the LCD.

Describing it in more detail, the LED package 10 includes an LED chip 12, cathode and anode leads 14 for supplying power to the LED chip 12 seated thereon, a package body 16 holding the leads 14 and an encapsulant 18 of a transparent resin filled into a cavity C of the package body 16 to encapsulate the LED chip 12 as shown in FIGS. 3 and 4.

Light beams L1 to L3 generated from the LED chip 12 are introduced into the light guide plate 20, and travel inside the light guide plate 20 before scattered at a dot pattern 22. When the light beam L1 is scattered upward at the dot pattern 22, it exits the light guide plate 20, thereby reaching the LCD panel 30 through the diffuser plate 26 and the prism sheet 28.

Describing the LED package 10 in more detail with reference to FIGS. 3 and 4, the cavity C of the LED package 10 where the encapsulant 18 is filled has a depth d generally of 600 μm to 650 μm. The depth d is determined mainly by the mounting height t of the LED chip 12, the height h1 of a loop of a wire W and the height h2 from the wire W up to the top surface of the encapsulant 18.

When the depth d has a larger value, the height h1+h2 from the top surface of the LED chip 12 to the top surface of the encapsulant 18 also increases. This, however, brings in following problems.

First, this restricts the beam angle α of the light emitted out of the LED package 10. When the beam angle α is smaller, the backlight unit 1 should use the more LED packages 10.

Second, as can be seen from FIG. 5, when light beams L generated from the LED chip 12 are emitted in the direction of arrow A, a partial light beam L1 collides against a sidewall 17 of the LED package 10. When collided against the side wall 17, the light beam 17 is lost due to for example absorption/scattering. This reduces the entire light quantity emitted out of the LED package 10. The light quantity decreases more when the sidewall 17 is higher, that is, the cavity depth d in FIG. 4 is larger.

Third, the higher sidewall 17 may cause more easily a molding defect such as a void in an upper or lower portion of the sidewall 17. This may take place particularly in a portion designated with the reference sign I in FIG. 3. With the molding defect, the LED package 10 is degraded in performance, and sometimes, should be discarded.

SUMMARY OF THE INVENTION

The present invention has been made to solve the foregoing problems of the prior art and therefore an aspect of the present invention is to provide a side view LED package in which the height of a sidewall is shortened to improve beam angle characteristics of emission light, increase light quantity, and prevent a molding defect of the sidewall.

According to an aspect of the invention, a side view LED package in use for a backlight unit includes a package body having a cavity with an inner sidewall inclined between a bottom and a top; first and second lead frames arranged in the package body, the cavity of the package body exposing a portion of at least one of the first and second lead frames placed in the bottom of the cavity to outside; a light emitting diode chip mounted on the bottom of the cavity to be electrically connected to the first and second lead frames; and a transparent encapsulant arranged in the cavity surrounding the light emitting diode chip. The cavity has a depth that is larger than a mounting height of the light emitting diode chip and does not exceed six times of the mounting height.

The mounting height of the light emitting diode chip may be from 50 μm to 200 μm. Here, the depth of the cavity is preferably from 200 μm to 480 μm.

According to another aspect of the invention, there is provided an approach to reduce the height of the wires since the wires act as a factor limiting the reduction of the depth of the cavity. The side view LED package according to this aspect of the invention includes a package body having a cavity with an inner sidewall inclined between a bottom and a top; first and second lead frames arranged in the package body, the cavity of the package body exposing a portion of at least one of the first and second lead frames placed in the bottom of the cavity to outside; a light emitting diode chip mounted on the bottom of the cavity to be electrically connected to the first and second lead frames; a transparent encapsulant arranged in the cavity surrounding the light emitting diode chip; and wire for electrically connecting the light emitting diode chip to at least one of the first and second lead frames, the wire having one end connected to a bump ball of the light emitting diode chip and the other end stitch-bonded to the lead frame. Here, the depth of the cavity is from 200 μm to 480 μm.

In this case, the height of the wire from the top of the LED chip to the top of the wire can be reduced preferably to 100 μm or less, and more preferably to the order of 70 μm. Thus, the afore-described bonding is advantageous to set the cavity depth in a small value.

According to further another aspect of the invention, there is provided an approach to design a cavity suitably in view of the convenience in the filling process of transparent and encapsulating liquid resin with respect to a relatively low depth and the formability of molding for a package body. The side view LED package of this aspect includes a package body having a cavity with an inner sidewall inclined between a bottom and a top; first and second lead frames arranged in the package body, the cavity of the package body exposing a portion of at least one of the first and second lead frames placed in the bottom of the cavity to outside; a light emitting diode chip mounted on the bottom of the cavity to be electrically connected to the first and second lead frames; and a transparent encapsulant arranged in the cavity surrounding the light emitting diode chip. Here, the depth of the cavity may be from 200 μm to 480 μm, the cavity may have a first width in a shorter axial direction and a second width in a longer axial direction perpendicular to the shorter axial direction, and the second width of the cavity may be from 1.5 mm to 1.7 mm at the bottom of the cavity. In view of the inclination angle of the sidewall, the second width of the cavity is preferably from 2.0 mm to 2.5 mm at a top end of the cavity.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

The present invention will now be described more fully hereinafter with reference to the accompanying drawings, in which preferred embodiments of the invention are shown.

Figure 6:
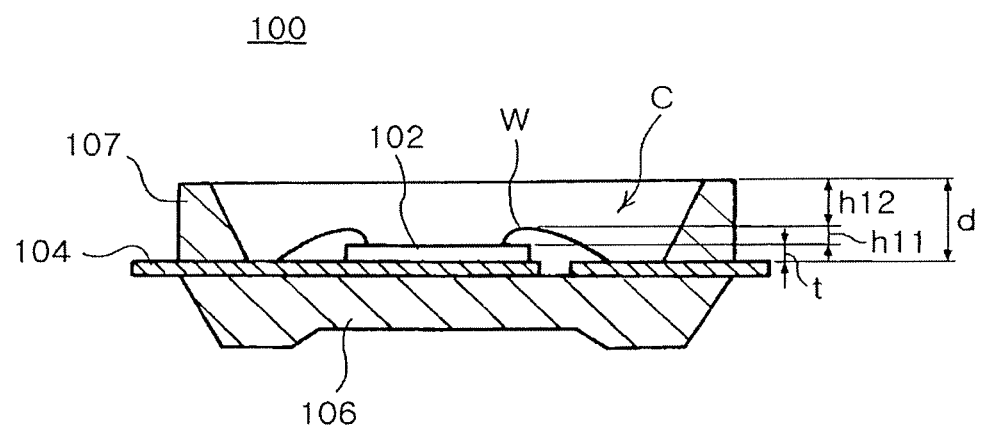
FIG. 6 is a cross-sectional view illustrating an LED package of the invention.

FIG. 6 is a cross-sectional view illustrating an LED package 100 according to an embodiment of the invention.

Figure 1:
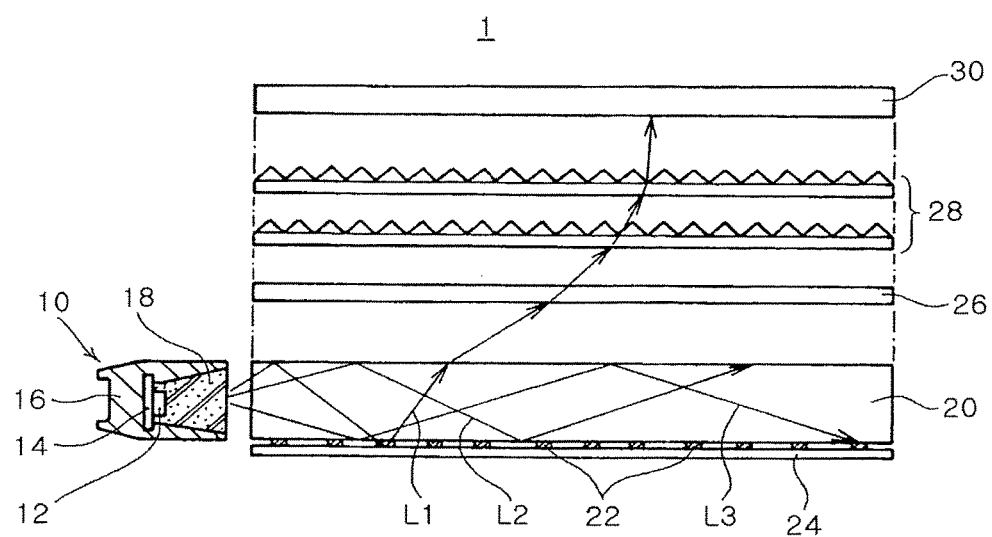
FIG. 1 is a perspective view illustrating a general backlight unit incorporating side view LED packages.
Figure 2:
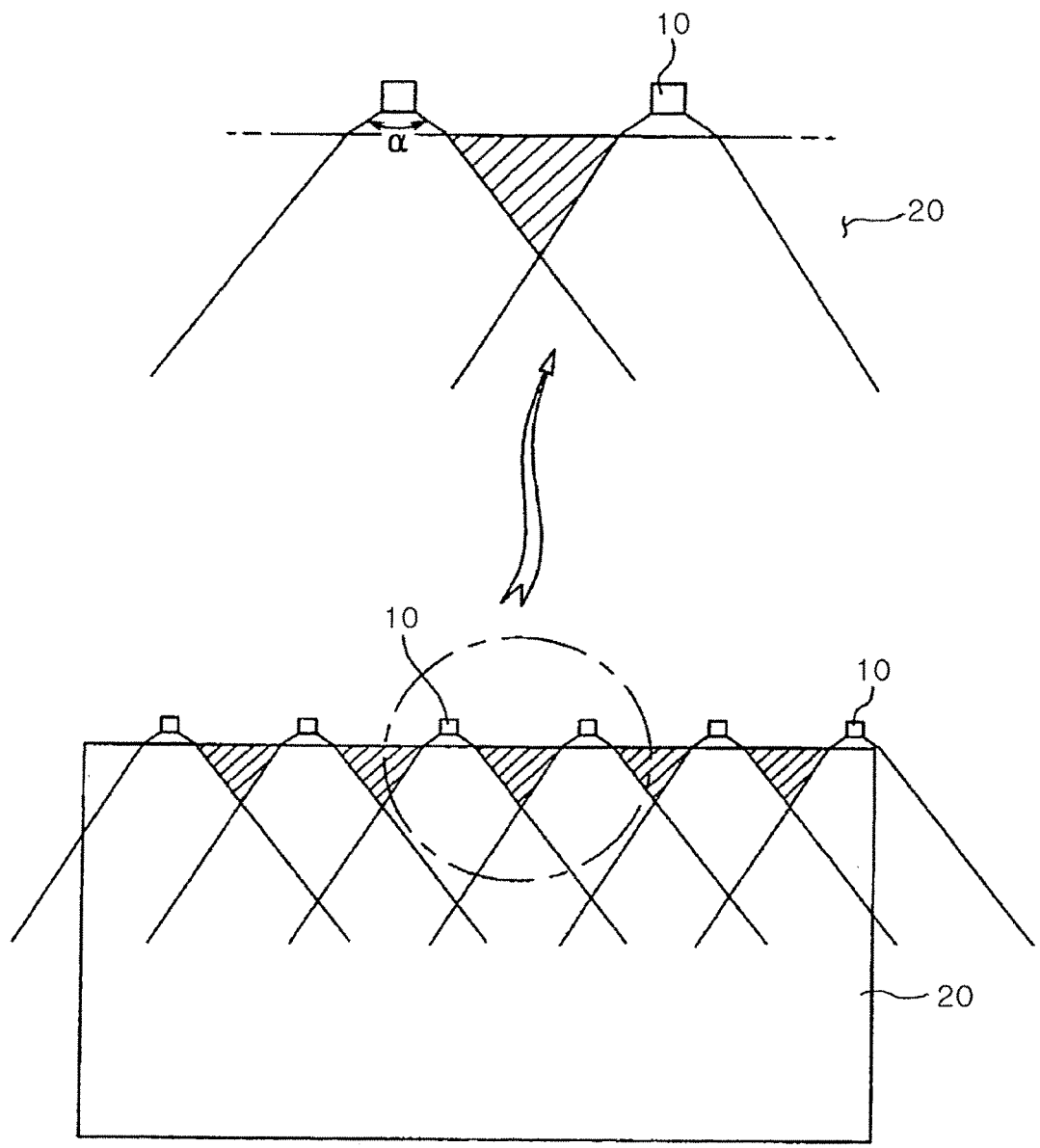
FIG. 2 is a perspective plan view of the backlight unit shown in FIG. 1.

Referring to FIG. 6, the side view LED package 100 of the invention is applied to the backlight unit 1 as shown in FIG. 1. The LED package 100 includes an LED chip 102, first and second lead frames 104 for supplying power to the LED chip 102 seated thereon, a package body 106 injection-molded to hold the first and second lead frames 104 and an encapsulant 108 of a transparent resin filled in a cavity C of the package body 106 to encapsulate the LED chip 102.

Figure 4:
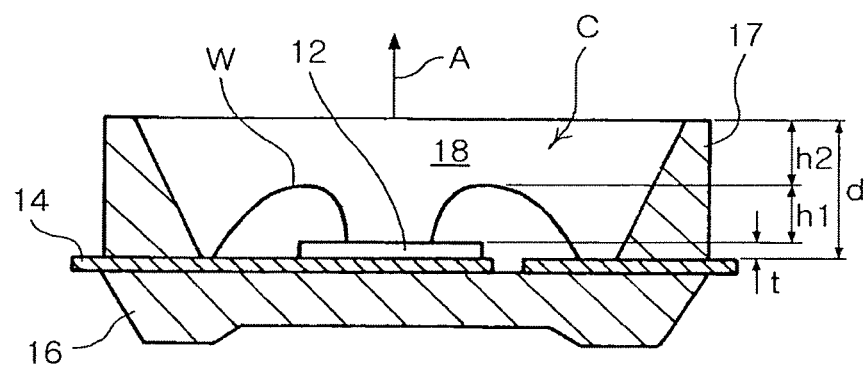
FIG. 4 is a cross-sectional view taken along the line 4-4 of FIG. 3.
Figure 5:
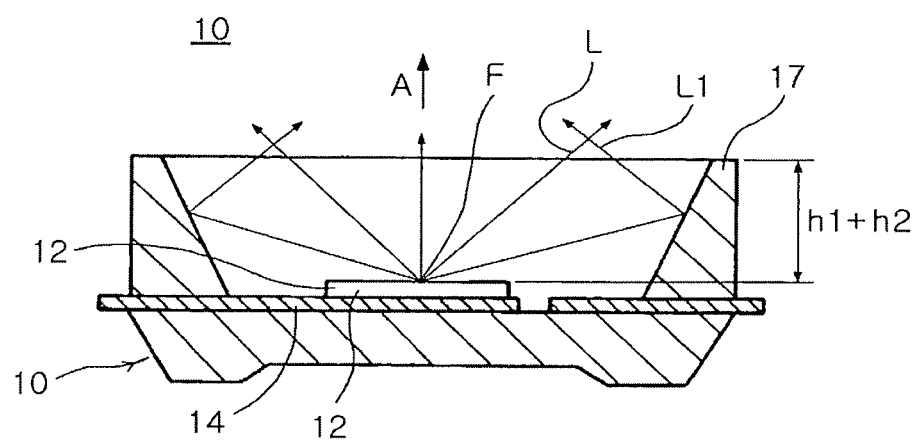
FIG. 5 is a cross-sectional view illustrating light absorption by sidewalls in the LED package shown in FIG. 4.

The LED package 100 according to this embodiment of the invention has an improvement in the cavity C in order to improve light quantity and beam angle. The height of a sidewall of the LED package 100, that is, the depth d of the cavity C is set to be larger than the height t of the LED chip 102 but not exceeding six (6) times of the same. Considering a typical LED chip mounting height (e.g., in the range from 50 μm to 200 μm), the depth d of the cavity C is set to be 200 μm to 480 μm. This is remarkably smaller than the cavity depth (600 μm to 650 μm) of the afore-described conventional LED package 10 (see FIG. 4).

Accordingly, the beam angle of light emitted out of the LED package 100 can be improved to be advantageously applied to the backlight unit. Describing it in more detail, in case of application to the backlight unit, LED packages with a larger beam angle can be decreased in number with respect to those with a smaller beam angle.

This structure also lowers the probability of light generated from the LED chip 102 to collide against the sidewall 107 so that light absorption/scattering by the sidewall 107 can be reduced to increase light quantity emitted out of the LED package 100.

Figure 9:
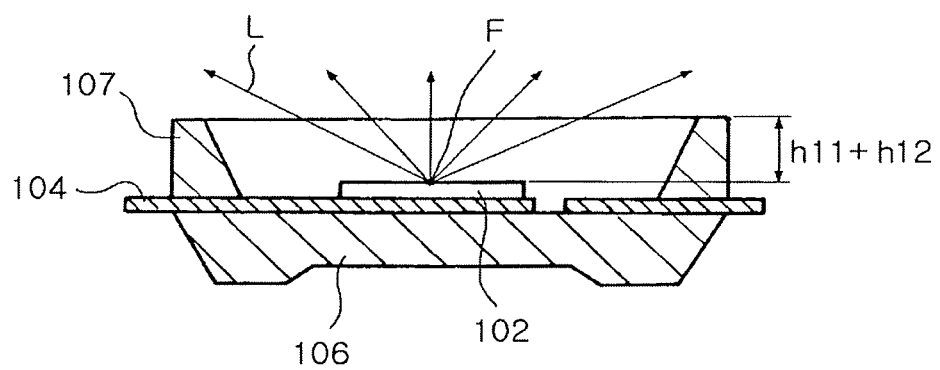
FIG. 9 is a cross-sectional view illustrating light emission from the LED package of the invention.

FIG. 9 shows light emission from the LED package 100 of this embodiment. As shown in FIG. 9, when light beams L are emitted from the focus F of the LED chip 102, most of the light beams L advance in the direction of arrow A without colliding against the sidewall 107. This can reduce light loss greatly, thereby raising light intensity greatly.

Furthermore, with reduction in the depth d of the cavity C, the sidewall 107 is also lowered in height. This can advantageously prevent a molding defect designated with the reference sign I in FIG. 3 that otherwise would readily take place in the injection molding of the package body.

With the LED package 100 of this embodiment adjusted in the depth d of the cavity C, it is possible to improve the performance of the LED package 100 as a light source and reduce any defects in the injection molding as well.

In general, as shown in FIG. 6, the side view LED package 100 has an electric connection of the LED chip 102 with the first and second LED frames 104 that can be realized by wires W.

In this case, the cavity depth is required to be larger than the wire height h11+t so that the wires W provided as an electrically connecting member can be arranged inside the transparent encapsulant. Like this, the wires W become a factor limiting the reduction of the depth d of the cavity C. In order to overcome this problem, an aspect of the invention provides an approach to reduce the height of the wires.

Now a wire bonding inside the LED package will be described with reference to FIGS. 7 and 8.

Figure 7:
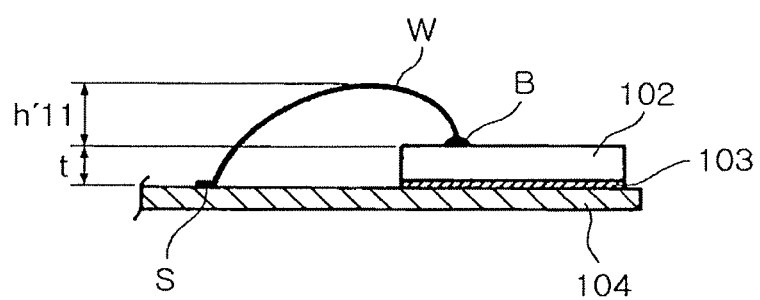
FIG. 7 is a cross-sectional view illustrating an exemplary wire bonding within the LED package of the invention.
Figure 8:
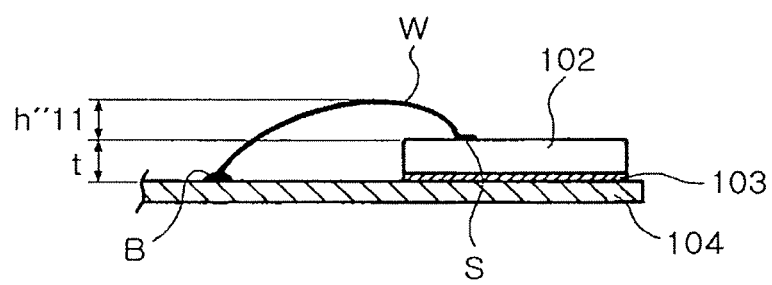
FIG. 8 is a cross-sectional view illustrating another exemplary wire bonding within the LED package of the invention.

Each of FIGS. 7 and 8 shows an LED chip 102 mounted on a lead frame 104 by means of an adhesive layer 103.

Referring to FIG. 7, the wire W is connected at one end to the LED chip 102 with a bump ball B. At the other end, the wire W is terminated with a stitch S that is connected to the lead frame 104.

With this type of wire bonding, the height h'11 of the wire W from the LED chip 102 to the top of the wire loop can be decreased to 150 µm. However, it is difficult to decrease the height h'11 of the wire W further. This is because the wire should be looped to a specific height above the LED chip 102 after bonded the LED chip 102.

On the contrary, referring to FIG. 8, the wire W is bonded at one end to the lead frame 104 with a bump ball B and terminated at the other end with a stitch S on the LED chip 102 to electrically connect the LED chip 102 with the lead frame 104.

In this arrangement, the height h"11 of the wire above the LED chip 102 can be further reduced from that shown in FIG. 7. This is because, when the wire W is looped upward to a total height (=h"11+t) from the lead frame 104 to which the wire W is bonded with the bump ball B, the mounting height t of the LED chip is included in the total height of the wire loop.

That is, when the wire bonding processes shown in FIGS. 7 and 8 are carried out with the same equipment and method, the total height h"11+t of the wire W as shown in FIG. 8 can be substantially the same as the partial height h'11 of the wire above the LED chip 102 as shown in FIG. 7. Accordingly, the cavity depth d of FIG. 8 can be set to be remarkably smaller than that of FIG. 7.

In the wire bonding of FIG. 8, the height h"11 of the wire W from the LED chip 102 can be reduced to the order of 100 µm or less, and preferably, to about 70 µm.

With the wire bonding as described above, it is possible to reduce the height necessary for the wire bonding remarkably from the prior art and thus decrease the cavity depth d remarkably.

Accordingly, with the wire bonding structure as shown in FIG. 8, it is possible to easily produce a side view LED package having a cavity depth d in the range from 200 µm to 480 µm.

The cavity depth d may be preferably 200 µm or more to ensure a suitable thickness of transparent resin, which will encapsulate the LED chip and/or wires not to be exposed to the external environment, considering the total height h"11+t of the wire W or the maximum mounting height of the LED chip in a case where the wire bonding structure is not adopted.

Considering a following transparent resin filling process, to further promote effects resulting from the improvement in the cavity, the cavity depth is more preferably 250 µm to 400 µm, and still more preferably on the order of 300 µm.

As another aspect, the invention provides an approach to suitably control the width of the cavity in view of the resin filling process for the transparent encapsulant and the percent defective in the injection molding of the package body.

Referring to the side view LED package 100 shown in FIG. 6, it is more desirable that the cavity depth d is smaller. However, as a drawback, the smaller cavity depth d causes difficulty to the resin filling process. This as a result requires precise procedures to fill the transparent resin such as silicone into the cavity C to form the transparent encapsulant 108. In particular, since the entire cavity C becomes smaller when the cavity depth d is reduced, it is required to precisely inject a small amount of resin into the cavity.

In general, the cavity has a first width in the shortest width direction (i.e., transverse width) and a second width P in the longest width direction (i.e., longitudinal width) perpendicular to the transverse direction. In this case, the resin filling process can be carried out efficiently.

Figure 3:
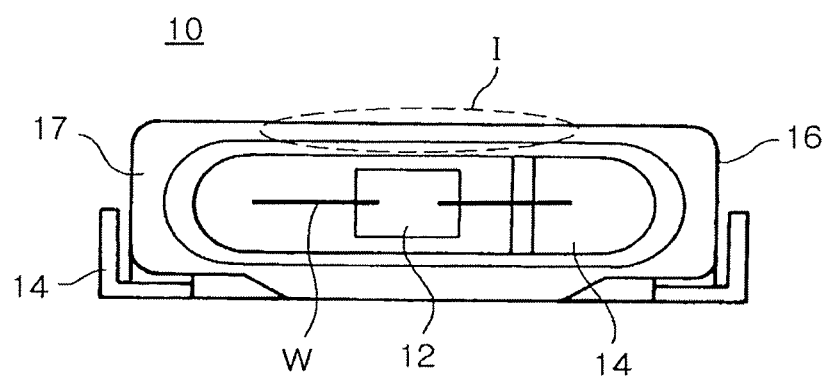
FIG. 3 is a front elevation view of a conventional side view LED package.

However, when the longitudinal width of the cavity is increased excessively, injection molding may readily cause defects to the package body 107 as illustrated in and described with reference to FIG. 3. Accordingly, the longitudinal width of the cavity is preferably restricted to a predetermined range.

Figure 16:
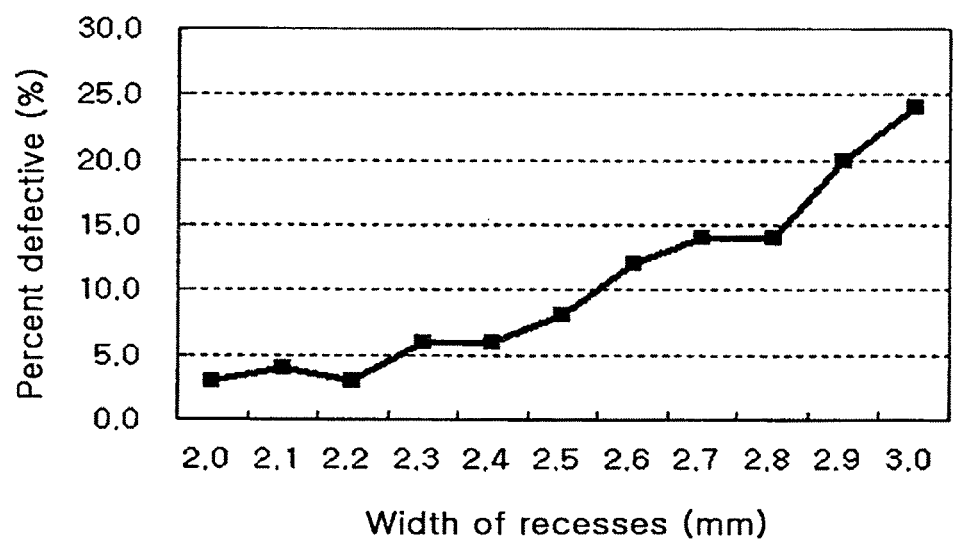
FIG. 16 is a graph illustrating the percent defective in injection molding of package bodies according to the width of recesses in LED packages.

The inventors have investigated the percent defective in the injection molding of resultant packages by increasing the cavity longitudinal width from 2.0 mm to 3.0 mm with other factors remaining the same. As a result, it was found that the percent defective in the injection molding sharply rises when the cavity longitudinal width P1 exceeds 2.5 mm as in the graph shown in FIG. 16.

In view of such results, the longitudinal width P1 at the top of the cavity C is set preferably from 2.0 mm to 2.5 mm. Considering the angle of the inner sidewall inclined for reflection, the longitudinal width P2 at the bottom of the cavity C is set preferably from 1.5 mm to 1.7 mm.

Like this, when the cavity longitudinal width P (P1, P2) is controlled together with the cavity depth d, a more excellent side view LED package can be provided.

Figure 10:
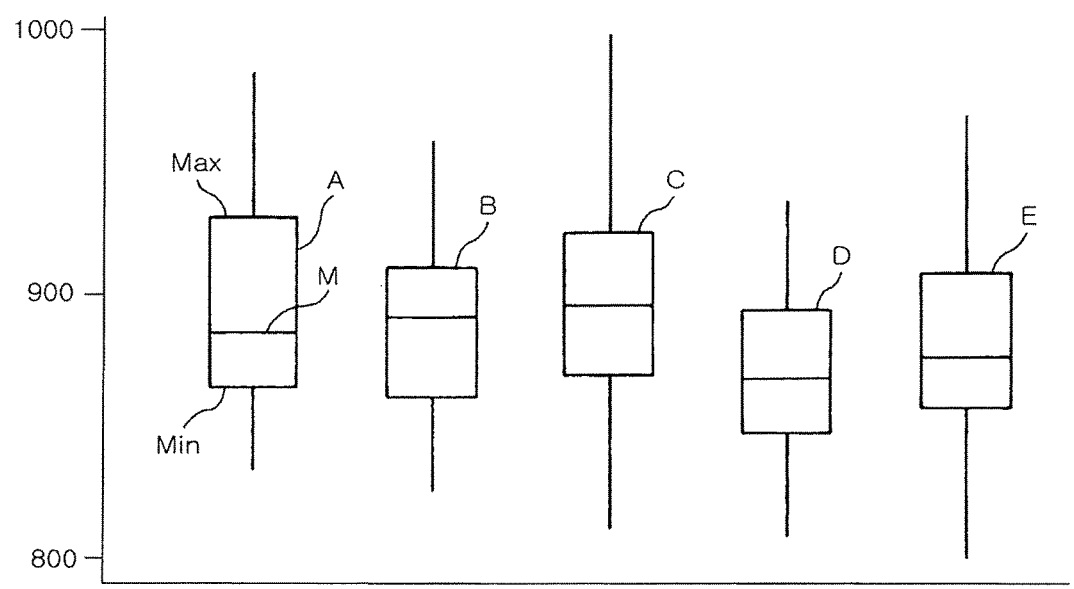
FIG. 10 is a graph, illustrating brightness levels according to several versions of the LED package of the invention.

FIG. 10 is a graph illustrating brightness levels according to several versions of the LED package of the invention. LED packages used in this experiment had a following structure: an LED mounting height of about 80 µm; and a wire height (up to the top of the wire including the LED mounting height) of about 170 µm to 180 µm.

In FIG. 10, A indicates an LED package with a cavity depth of 300 µm and cavity longitudinal widths 1.5 mm (bottom) and 2.0 mm (top); B indicates an LED package with a cavity depth of 300 µm and cavity longitudinal widths 1.5 mm (bottom) and 2.2 mm (top); C indicates an LED package with a cavity depth of 300 µm and cavity longitudinal widths 1.7 mm (bottom) and 2.2 mm (top); D indicates an LED package with a cavity depth of 400 µm and cavity longitudinal widths 1.5 mm (bottom) and 2.2 mm (top); and E indicates an LED package with a cavity depth of 400 µm and cavity longitudinal widths 1.7 mm (bottom) and 2.2 mm (top). Here, the individual packages used an LED chip having 18 mW output.

As seen from FIG. 10, it is brighter when the cavity depth is larger. Of course, the angle of the sidewall, that is, the ratio of the cavity longitudinal width at the bottom to the cavity longitudinal width at the top also affects the brightness. However, the width ratio is relatively insignificant compared to the cavity depth.

Figure 11:
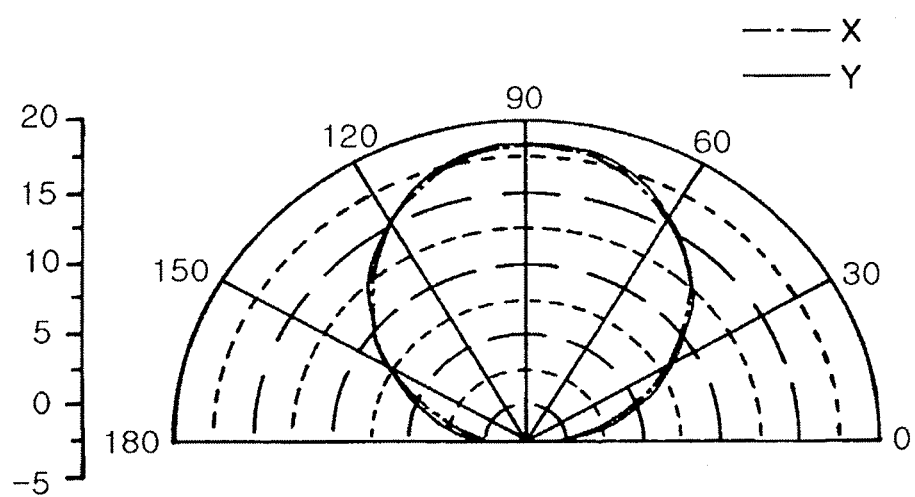
FIG. 11 is a graph illustrating beam angle characteristics of the LED package of the invention.
Figure 12:
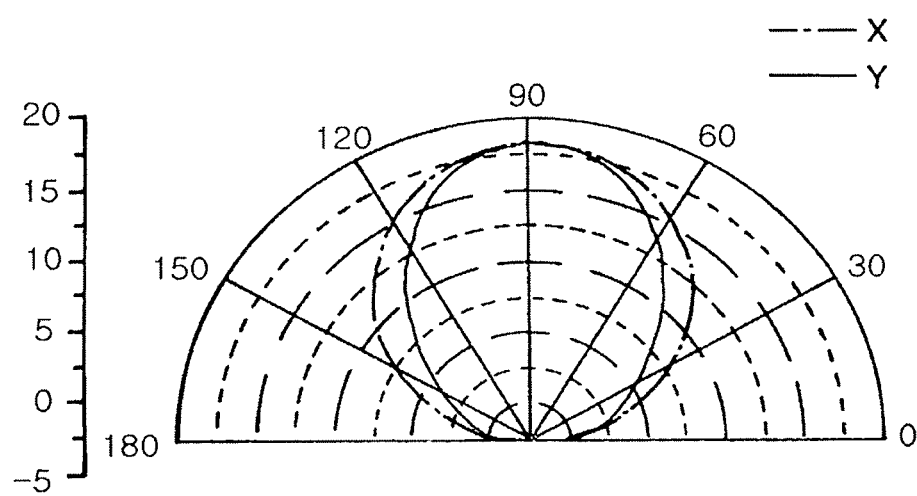
FIG. 12 is a graph illustrating beam angle characteristics of a conventional LED package.

FIG. 11 is a graph illustrating beam angle characteristics of an LED package of the invention, and FIG. 12 is a graph illustrating beam angle characteristics of a conventional LED package. The LED packages used in FIGS. 11 and 12 had a chip mounting height and a wire height similar to those shown in FIG. 10.

As a difference, the side view LED package of the invention had a cavity depth of 300 µm and the conventional side view LED package had a cavity depth of 650 µm.

Observing beam angle characteristics of the LED packages, the LED package of the invention had beam angles of 114.2° in X axis (width direction of the LED package) and 115.3° in Y axis (thickness direction of the LED package perpendicular to the width direction). On the other hand, the conventional LED package had beam angles of 111.5° in X axis and 91.7° in Y axis. From these numeric values, it is apparent that the beam angle characteristics were improved in the invention.

Figure 13:
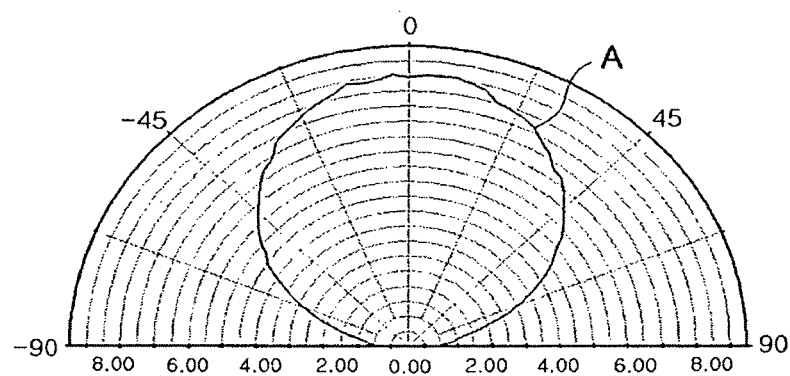
FIGS. 13 to 15 are graphs illustrating beam angle characteristics according to several versions of the LED package of the invention.
Figure 14:
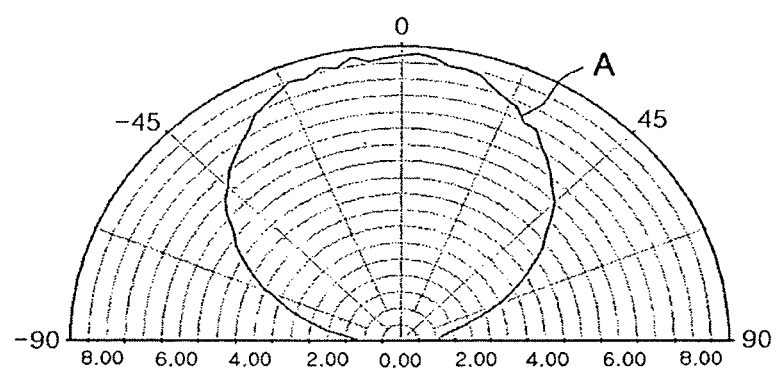
Figure 15:
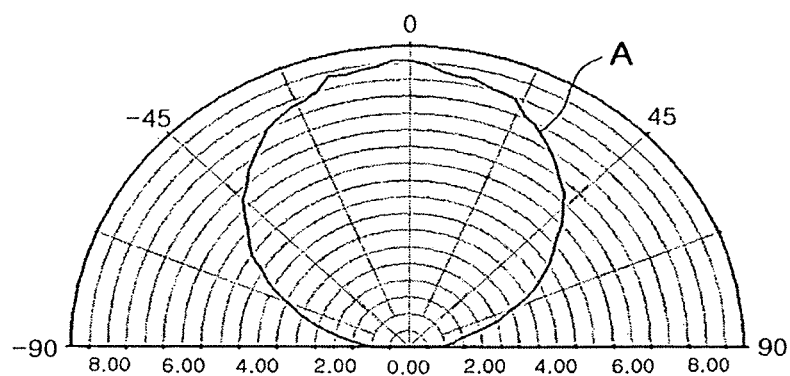

FIGS. 13 to 15 are graphs illustrating beam angle characteristics according to several versions of the LED package of the invention.

Three versions of the LED package of the invention were produced and beam angles according to the individual LED package versions were observed.

The LED package in FIG. 13 had a cavity depth of 500 μm, in which transparent resin was NMW114WA available from Otsuka of Japan was and fluorescent material was G3, which were mixed at a ratio of 12:1. The beam angles A of the LED package observed in FIG. 13 were 119.6° in a longer axis, that is, the width direction of the LED package, and 105.8° in a shorter axis.

The LED package in FIG. 14 had a cavity depth of 400 μm, in which fluorescent material transparent resin was NMW114WA available from Otsuka of Japan was and fluorescent material was G3, which were mixed at a ratio of 12:1. The beam angles A of the LED package observed in FIG. 13 were 121.6° in a longer axis, that is, the width direction of the LED package, and 114.8° in a shorter axis.

The LED package in FIG. 15 had a cavity depth of 400 μm, in which transparent resin was NMW114WA available from Otsuka of Japan and fluorescent material was TAG, which were mixed at a ratio of 12:1. The beam angles A of the LED package observed in FIG. 13 were 120.7° in a longer axis, that is, the width direction of the LED package, and 118.7° in a shorter axis.

In the side view LED package of the invention as described hereinbefore, the height of the sidewall is shortened to improve beam angle characteristics of emission light, increase light quantity, and prevent a molding defect of the sidewall.

While the present invention has been described with reference to the particular illustrative embodiments and the accompanying drawings, it is not to be limited thereto but will be defined by the appended claims. It is to be appreciated that those skilled in the art can substitute, change or modify the embodiments into various forms without departing from the scope and spirit of the present invention.

What is claimed is:

1. A light emitting diode package comprising:
a molded package body formed of a molding material having a first surface defining a mounting surface of the molded package, a second surface opposed to the first surface and side surfaces positioned between the first and second surfaces, the molded package body including a cavity formed on one of the side surfaces and sidewalls surrounding the cavity;
first and second lead frames arranged in the molded package body, the cavity of the molded package body exposing a portion of at least one of the first and second lead frames placed in the bottom of the cavity to outside;
a light emitting diode chip mounted on the bottom of the cavity to be electrically connected to the first and second lead frames; and
a transparent encapsulant arranged in the cavity surrounding the light emitting diode chip, and including a fluorescent material,
wherein the depth of the cavity is from 250 μm to 400 μm, and the mounting height of the light emitting diode chip is from 50 μm to 200 μm,
wherein the cavity has a first width in a shorter axis direction and a second width in a longer axis direction perpendicular to the shorter axis direction, the second width at a top end of the cavity is from 2.0 mm to 2.5 mm and the second width of the cavity is from 1.5 mm to 1.7 mm at the bottom of the cavity,
wherein a beam angle of the light emitting diode package is more than 114.8° in the shorter axis direction, and a difference between the beam angle in the shorter axis direction and a beam angle in the longer axis direction is 6.5° or less.

2. The light emitting diode package according to claim 1, wherein the sidewalls include two first sidewalls along the longer axis direction and two second sidewalls along the shorter axis direction, and the second sidewalk have smaller widths than those of the first sidewalls.

3. The light emitting diode package according to claim 1, further comprising an adhesive layer disposed between the light emitting diode chip and the bottom of the cavity.

4. The light emitting diode package according to claim 1, wherein each of the sidewalls has an inner surface inclined between the bottom and a top of the cavity.

5. The light emitting diode package according to claim 4, further comprising wire for electrically connecting the light emitting diode chip to at least one of the first and second lead frames.

6. The light emitting diode package according to claim 5, wherein the wire has one end connected to a bump ball of the lead frame and the other end stitch-bonded to the light emitting diode chip.

7. The light emitting diode package according to claim 5, wherein the wire is arranged in such a fashion that a height from a top surface of the light emitting diode chip to a top end of the wire is 100 μm or less.

8. A light emitting diode package comprising:
a molded package body formed of a molding material and having a first surface defining a mounting surface of the molded package, a second surface opposed to the first surface and side surfaces positioned between the first and second surfaces, the molded package body including a cavity formed on one of the side surfaces and sidewalls surrounding the cavity;
first and second lead frames arranged in the molded package body, the cavity of the molded package body exposing a portion of at least one of the first and second lead frames placed in the bottom of the cavity to outside;
a light emitting diode chip mounted on the bottom of the cavity to be electrically connected to the first and second lead frames;
an adhesive layer disposed between the light emitting diode chip and the bottom of the cavity and having substantially the same area as the mounting area of the light emitting diode chip; and
a transparent encapsulant arranged in the cavity surrounding the light emitting diode chip, and including a fluorescent material,
wherein the depth of the cavity is from 250 μm to 400 μm, and the mounting height of the light emitting diode chip is from 50 μm to 200 μm,
wherein each of the sidewalk has an inner surface inclined between the bottom and a top of the cavity, and the cavity has a first width in a shorter axis direction and a second width in a longer axis direction perpendicular to the shorter axis direction, the second width at a top end of the cavity is from 2.0 mm to 2.5 mm and the second width of the cavity is from 1.5 mm to 1.7 mm at the bottom of the cavity,
wherein a beam angle of the light emitting diode package is more than 114.8° in the shorter axis direction, and a difference between the beam angle in the shorter axis direction and a beam angle in the longer axis direction is 6.5° or less.

9. The light emitting diode package according to claim 8, wherein the molded package body is formed of a molding material, and the sidewalls include two first sidewalk along the longer axis direction and two second sidewalls along the shorter axis direction, the second sidewalls having smaller widths than those of the first sidewalls.

10. A light emitting diode package comprising:
a molded package body formed of a molding material and having a first surface defining a mounting surface of the molded package, a second surface opposed to the first surface and side surfaces positioned between the first and second surfaces, the molded package body including a cavity formed on one of the side surfaces and sidewalls surrounding the cavity;
first and second lead frames arranged in the molded package body, the cavity of the molded package body exposing a portion of at least one of the first and second lead frames placed in a bottom of the cavity to outside;
a light emitting diode chip mounted on the bottom of the cavity to be electrically connected to the first and second lead frames; and
a transparent encapsulant arranged in the cavity surrounding the light emitting diode chip, and including a fluorescent material,
wherein the depth of the cavity is from 250 μm to 400 μm, the mounting height of the light emitting diode chip is from 50 μm to 200 μm, and the package body is divided into an upper portion and a lower portion with respect to the first and second lead frames, and a thickness of the upper portion is substantially equal to or less than a thickness of the lower portion,
wherein the cavity has a first width in a shorter axis direction and a second width in a longer axis direction perpendicular to the shorter axis direction, the second width at a top end of the cavity is from 2.0 mm to 2.5 mm and the second width of the cavity is from 1.5 mm to 1.7 mm at the bottom of the cavity,
wherein a beam angle of the light emitting diode package is more than 114.8° in the shorter axis direction, and a difference between the beam angle in the shorter axis direction and a beam angle in the longer axis direction is 6.5° or less.

* * * * *